United States Patent [19]
Matsui

[11] Patent Number: 5,337,276
[45] Date of Patent: Aug. 9, 1994

[54] READ/WRITE CONTROL DEVICE FOR RANDOM ACCESS MEMORY

[75] Inventor: Masataka Matsui, Yokohama, Japan

[73] Assignee: Kabushiki Kaisha Toshiba, Tokyo, Japan

[21] Appl. No.: 969,436

[22] Filed: Oct. 30, 1992

[30] Foreign Application Priority Data

Oct. 31, 1991 [JP] Japan .................. 3-286252

[51] Int. Cl.$^5$ .................. G11C 7/00
[52] U.S. Cl. .................. 365/189.11; 365/189.01
[58] Field of Search .............. 365/189.11, 189.01, 365/226, 190, 191

[56] References Cited

U.S. PATENT DOCUMENTS

| | | | |
|---|---|---|---|
| 4,811,292 | 3/1989 | Watanabe | 365/189.11 |
| 4,841,488 | 6/1989 | Sanada | 365/189.11 |
| 4,894,803 | 1/1990 | Aizaki | 365/189.11 |
| 4,972,375 | 11/1990 | Ueno | 365/189.11 |
| 5,031,149 | 7/1991 | Matsumoto | 365/189.11 |

Primary Examiner—Eugene R. LaRoche
Assistant Examiner—A. Zarabian
Attorney, Agent, or Firm—Spensley Horn Jubas & Lubitz

[57] ABSTRACT

A first threshold value for detecting a potential indicating a read state, and a second threshold value for detecting a write state are set in an inverter circuit, to which a read/write signal R/W for setting the state of a memory cell is supplied, by means of a P-channel transistor, an N-channel transistor, and another P-channel transistor which is much smaller in gate width than the above transistors. The first or second threshold value is selected by a logic circuit constituted by an inverter circuit and a delay circuit in accordance with the level of the read/write signal R/W. Therefore, a change from a read state to a write state and a reverse change can be detected at high speed, thus providing a read/write control circuit for a random access memory, which can increase the speed of a read operation immediately after a write operation while ensuring a sufficient data write time, and can shorten the write recovery time.

8 Claims, 5 Drawing Sheets

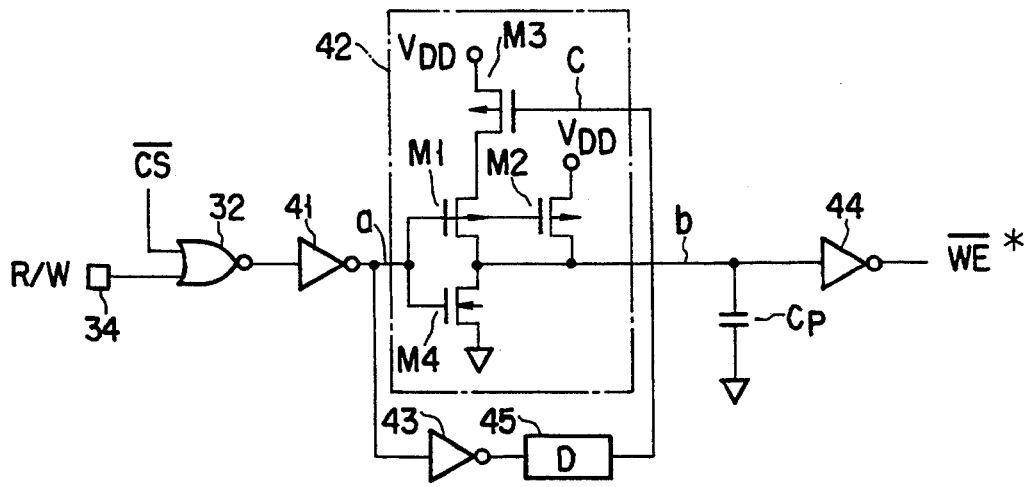
F I G. 3
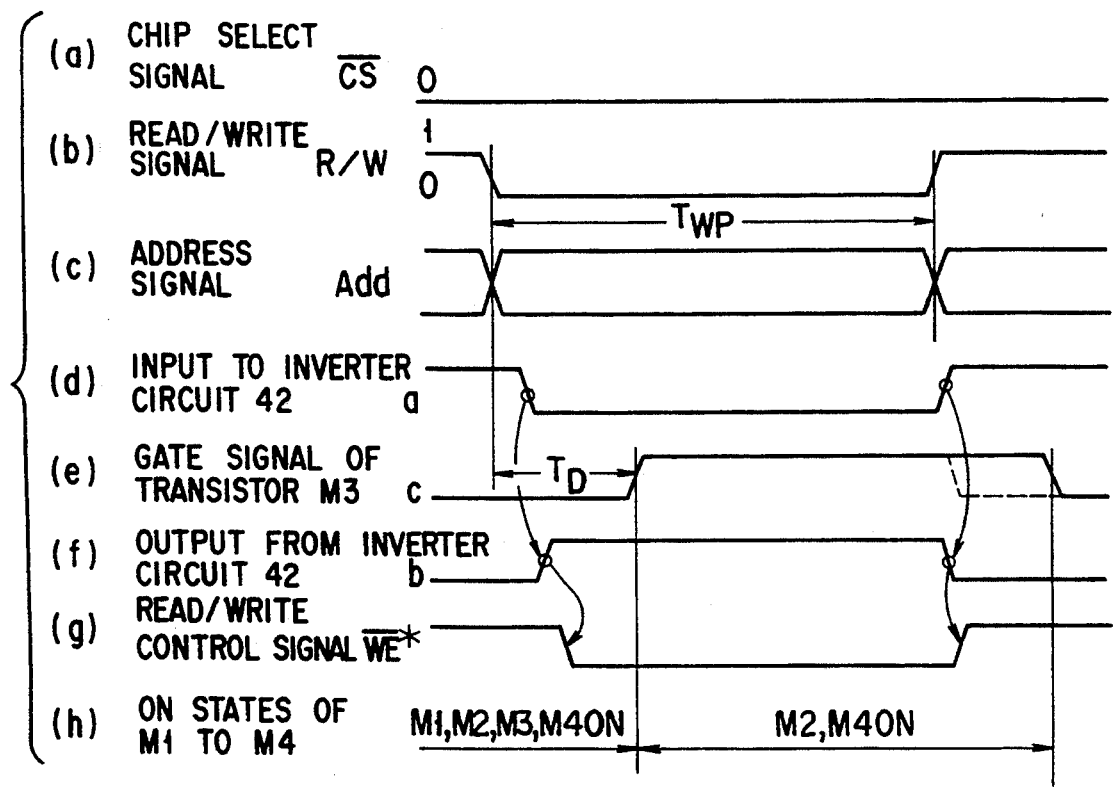
F I G. 4

READ/WRITE CONTROL DEVICE FOR RANDOM ACCESS MEMORY

BACKGROUND OF THE INVENTION

1. Field of the Invention

The present invention relates to a random access memory (to be referred to as a RAM hereinafter) mounted on a semiconductor substrate and, more particularly, to a read/write control circuit for use in an asynchronous RAM whose operating state is uniquely defined by the states of signals input to a chip.

2. Description of the Related Art

As an asynchronous RAM of this type, an asynchronous static RAM using static memory cells is available.

FIG. 1 is a circuit diagram showing a conventional asynchronous static RAM. This static RAM will be described below as a 4-bit RAM. Static RAM cells 11 to 14 are connected bit lines BL1, $\overline{BL1}$, BL2, and $\overline{BL2}$ and word lines WL1 and WL2. A bit line load circuit 15 and a column selecting circuit 16 are connected to the bit lines BL1, $\overline{BL1}$, BL2, and $\overline{BL2}$. Address signals A0 and A1 are supplied to input pins 17 and 18. Each of these input pins 17 and 18 is connected to one input terminal of a corresponding one of NOR circuits 19 and 20. The output terminal of the NOR circuit 19 is connected to a row decoder 21 for decoding the address signals A0 and A1 and selecting the word lines WL1 and WL2. The output terminal of the NOR circuit 20 is connected to a column decoder 22 for decoding the address signals A0 and A1 and selecting the bit lines BL1, $\overline{BL1}$, BL2, and $\overline{BL2}$ through the column selecting circuit 16. The output terminals of a write buffer 23 and the input terminals of a sense amplifier 24 are connected to the column selecting circuit 16. The write buffer 23 serves to write data in selected one of the static RAM cells 11 to 14. The sense amplifier 24 serves to amplify data read out from selected one of the static RAM cells 11 to 14. An input pin 25, to which input data Din is input, is connected to one input terminal of the write buffer 23. The output terminal of the sense amplifier 24 is connected to the first input terminal of an output buffer 27 through an inverter circuit 26. The output terminal of the output buffer 27 is connected to an output pin 28 for outputting output data Dout. A chip select signal $\overline{CS}$ is supplied to an input pin 29. This input pin 29 is connected to the other input terminal of each of the NOR circuits 19 and 20 through inverter circuits 30 and 31, and is also connected to one input terminal of each of NOR circuits 32 and 33. In addition, a read/write signal R/W is supplied to an input pin 34. This input pin 34 is connected to both the other input terminal of the NOR circuit 32 and the other input terminal of the NOR circuit 33. The NOR circuit 33 serves to generate an output enable signal OE. The output terminal of the NOR circuit 33 is connected to the second input terminal of the output buffer 27. Furthermore, the output terminal of the NOR circuit 32 is connected to the other input terminal of the write buffer 23 and a gate circuit 23a.

In the above-described arrangement, when the memory is set in the read mode, data read out from a selected memory cell is supplied to the sense amplifier 24 through corresponding bit lines and the column selecting circuit 16. The data is amplified by the sense amplifier 24 and is subsequently output from the output pin 28 through the output buffer 27. When the memory is set in the write mode, the input data Din input through the input pin 25 is written in a selected memory cell. The read and write modes of the memory are switched in accordance with the read/write signal R/W supplied to the input pin 34. More specifically, if the read/write signal R/W is "1", the read mode is set to activate the sense amplifier 24 and the output buffer 27. In contrast to this, if the read/write signal R/W is "0", the write mode is set to activate the write buffer 23. The above-described read/write operation is performed only when the chip select signal $\overline{CS}$ is "0". When the chip select signal $\overline{CS}$ is "1", the memory is set in the standby mode. The operating state of the asynchronous static RAM is uniquely determined by the states of the read/write signal R/W, the chip select signal $\overline{CS}$, and an address signal but is not influenced by the past history. Therefore, the asynchronous static RAM can be easily controlled and used and can be operated at high speed.

Although the operating state of the asynchronous static RAM is uniquely determined by signals supplied to the input pin, it must be guaranteed that the RAM is operated according to the values designated by the specifications regardless of the timing at which signals are input. For this reason, in a RAM of this type, it is difficult to guarantee predetermined performance especially associated with a read/write mode switching operation. More specifically, consider a write recovery time $T_{WR}$ shown in FIG. 2A as one of specifications of such a RAM. Referring to FIG. 2A, reference symbol $T_{WP}$ denotes a write time; and $T_{AS}$, a setup time. The write recovery time $T_{WR}$ defines the time difference between the time at which the write mode is switched to the read mode, i.e., the read/write signal R/W supplied to the input pin 34 changes from "0" to 37 0", and the time at which an address signal Add changes. As the write recovery time $T_{WR}$ is closer to "0" second, as shown in FIG. 2B, switching to a read operation of data defined by the next address can be performed at a higher speed after the write operation is completed, thus allowing an increase in operating frequency. If, however, the write recovery time $T_{WR}$ is set to be close to "0" second, a write operation may be completed before the next address is selected. As a result, a read time delay may be caused. In the worst case, the write recovery time $T_{WR}$ becomes a negative value to destroy data in a memory cell.

In order to ensure the write recovery time $T_{WR}$ designated by the specifications, the following method may be used. The threshold voltage of a logic gate constituted by the inverters and the like in the write buffer 23, to which the read/write signal R/W is supplied, is set beforehand to a level at which a change in the read/write signal R/W from "0" to "1" can be easily detected. With this method, the write recovery time $T_{WR}$ can be set to be close to "0" second. In the above-described method, however, the timing at which the read mode is switched to the write mode is delayed, and hence the timing at which a data write operation is started is delayed. For this reason, the minimum write time $T_{WP}$ designated by the specifications cannot be ensured.

SUMMARY OF THE INVENTION

The present invention has been made to solve the above problem, and has as its object to provide a read/write control circuit for a random access memory, which can increase the speed of a read operation immediately after a write operation while ensuring a sufficient data write time, and can shorten the write recovery time.

According to an aspect of the present invention, there is provided a read/write control circuit for a random access memory, comprising: a supply circuit for supplying a read/write control signal to the random access memory to asynchronously control a read/write state thereof with a binary potential; and a shift circuit for shifting a threshold value of the supply circuit to a level close to a read potential during a write operation of the random access memory.

According to another aspect of the present invention, there is provided a read/write control circuit for a random access memory, comprising: a first logic circuit for receiving a read/write signal for asynchronously determining a read/write state of a memory cell with a binary potential, the first logic circuit having a first threshold value which is close to a potential indicating a write state and serves to detect a change from the potential indicating the write state to a potential indicating a read state, and a second threshold value which is close to the potential indicating the read state and serves to detect a change from the potential indicating the read state to the potential indicating the write state; and a second logic circuit for selecting the first threshold value in accordance with the read signal, and selecting the threshold value in accordance with the write signal.

In the present invention, the first threshold value, which is close to the potential indicating the write state and serves to detect a change from the potential indicating the write state to the potential indicating the read state, and the second threshold value, which is close to the potential indicating the read state and serves to detect a change from the potential indicating the read state to the potential indicating the write state, are set in the first logic circuit to which a read/write signal for asynchronously determining the read/write state of a memory cell with a binary potential is supplied, and the first or second threshold value is selected by the second logic circuit in accordance with the level of the read/write signal, thereby increasing the speed of a read operation immediately after a write operation while ensuring a sufficient data write time, and shortening the write recovery time.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a circuit diagram showing the first embodiment of the present invention;

FIGS. 4(a) to 4(h) are timing charts for explaining an operation of the first embodiment shown in FIG. 3;

DETAILED DESCRIPTION OF THE PREFERRED EMBODIMENTS

Figure 1:
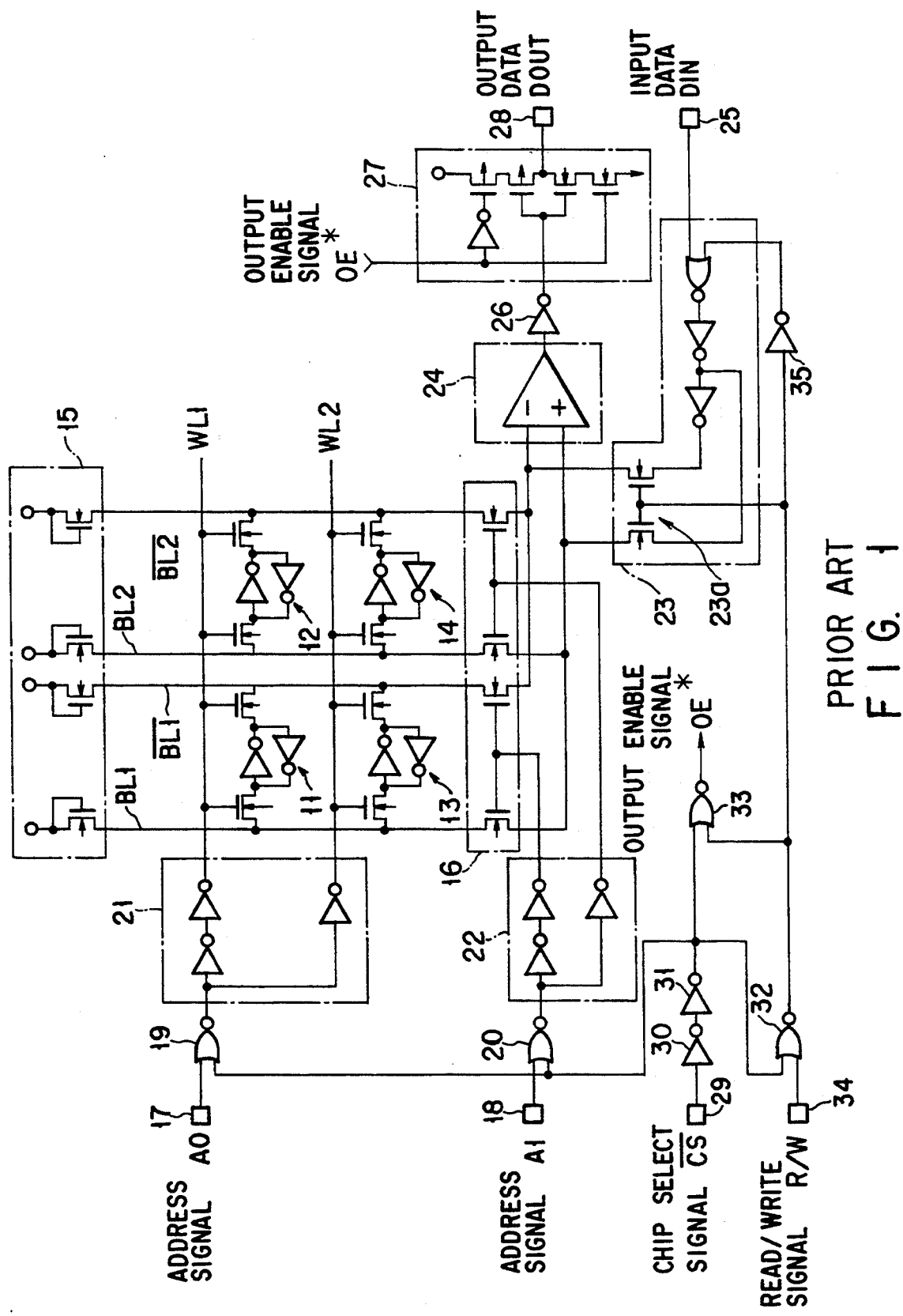
FIG. 1 is a circuit diagram showing the arrangement of a random access memory.
Figure 2A:
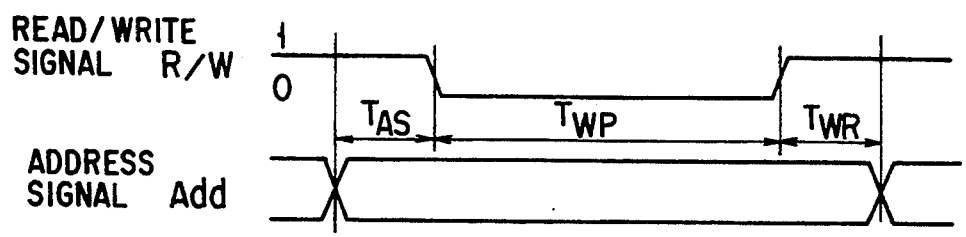
FIGS. 2A and 2B are timing charts, respectively, for explaining an operation of the memory shown in FIG. 1.
Figure 2B:
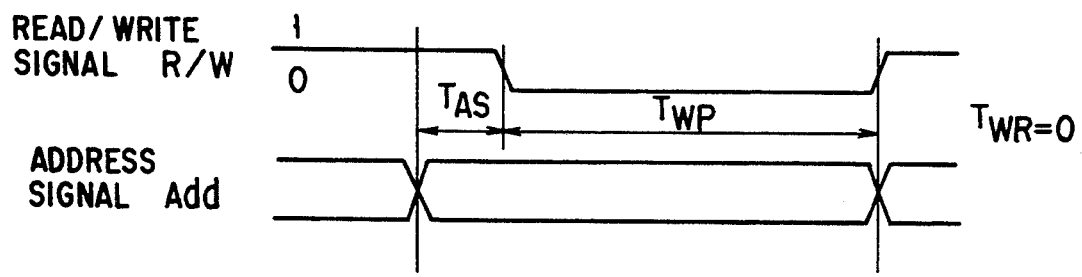

Embodiments of a read/write control circuit for a random access memory according to the present invention will be described with reference to the accompanying drawings. Note that the same reference numerals in FIGS. 2 to 7(g) denote the same parts as in FIG. 1.

FIG. 3 is a circuit diagram showing a read/write control circuit for an asynchronous RAM according to the first embodiment of the present invention. Referring to FIG. 3, the input terminals of second and third inverter circuits 42 and 43 are connected to the output terminal of a NOR circuit 32 through a first inverter circuit 41. The second inverter circuit 42 is constituted by P-channel transistors M1, M2, and M3 and an N-channel transistor M4. More specifically, the gates of the P-channel transistor M1 and the N-channel transistor M4 are connected to the output terminal of the first inverter circuit 41, while the drain of the P-channel transistor M1 is connected to the drain of the N-channel transistor M4. The source of the N-channel transistor M4 is grounded. The source of the P-channel transistor M1 is connected to the drain of the p-channel transistor M3. The source of the P-channel transistor M3 is connected to a power supply $V_{DD}$. The gate of the P-channel transistor M2 is connected to the gate of the P-channel transistor M1, while the source of the P-channel transistor M2 is connected to the power supply VDD. The drain of the P-channel transistor M2 is connected to the drains of the P- and N-channel transistors M1 and The size, i.e., the gate width, of the P-channel transistor M2 is set to be as small as 1/10 to 1/20 that of the N-channel transistor M4. The P-channel transistors M1 and M3 and the N-channel transistor M4 have the same size. The drains of the P-channel transistors M1 and M2 and of the N-channel transistor M4 are connected to the input terminal of an inverter circuit 44. A wiring capacitor $C_P$ is connected to the input terminal of the inverter circuit 44, while its output terminal is connected to the other input terminal of a NOR circuit 33, an inverter circuit 35, and a gate circuit 23a, which components are identical to those shown in FIG. 1. The output terminal of the third inverter circuit 43 is connected to the gate of the P-channel transistor M3 through a delay circuit 45 having a predetermined delay time $T_D$. The delay time $T_D$ of the delay circuit 45 is set to be slightly shorter than a data write time $T_{WP}$.

FIGS. 4(a) to 4(h) are timing charts for explaining an operation of the first embodiment shown in FIG. 3. As shown in FIG. 3, when a read/write signal R/W changes from a read level to a write level, i.e., from level "1" to level "0", since the p-channel transistor M3 is kept on during the delay time $T_D$ of the delay circuit 45 through the third inverter circuit 43 and the delay circuit 45, as shown in FIGS. 4(e) and 4(h), the threshold value of the second inverter circuit 42 is determined by the ratio of the size of a series/parallel-connected circuit of the P-channel transistors M1, M2, and M3 to that of the N-channel transistor M4. As described above, since the size of each of the P-channel transistors M1 and M3 is larger than that of the P-channel transistor M2, the threshold value of the inverter circuit 42 is shifted to near level "1" to allow easy detection of a shift to the write mode. Consequently, a change in the read/write signal R/W from level "1" to level "0" can be detected at high speed, and a shift to the write mode can be quickly made. Therefore, a sufficient write time $T_{WP}$ can be ensured. On the other hand, if the read/write signal R/W changes from the write level to the read level, i.e., from level "0" to level "1", the output signal from the inverter circuit 43 is set at level "1". As a result, the P-channel transistor M3 is kept off (the transistor M1 is also kept off), and only the P-channel transistor M2 is kept on. For this reason, the threshold value of the inverter circuit 42 is determined by the ratio of the size of the P-channel transistor M2 to that of the N-channel transistor M4. Since the size of the P-channel transistor M2 is much smaller than that of the N-channel transistor M4, as described above, the threshold value of the inverter circuit 42 in the write mode is set to be close to level "0". That is, a shift from the write mode to the read mode, i.e., a change in the read/write signal R/W from level "0" to level "1", can be detected at high speed. Therefore, the speed of a change in read/write control signal $\overline{WE^*}$, output from the inverter circuit 44, from level "0" to level "1" can be increased. In general, if the size of the P-channel transistor M2 in a CMOS is small, the through current from the P-channel transistor M2 to the N-channel transistor M4 is reduced. Therefore, this also contributes to an increase in operating speed.

As described above, the threshold value of the inverter circuit 42 is controlled by an ON/OFF operation of the P-channel transistor M3. This switching operation of the P-channel transistor M3 is controlled by the delay time determined by the inverter circuit 43 and the delay circuit 45. As a result, the threshold value of the inverter circuit 42 (the level at a point b) is shifted to different levels in accordance with an upward change in the level of the read/write signal R/W (the transistors M2 and M4: ON) and a downward change therein (the transistors M1, M2, M3 and M4: ON). Therefore, by setting the delay time of the delay circuit 45 to be slightly shorter than the data write time $T_{WP}$, the threshold value of the inverter circuit 42 can be reliably switched to a given value, and an oversensitive change in threshold value of the inverter circuit 42 with respect to noise and the like contained in the read/write signal R/W can be prevented, thereby ensuring a stable operation.

Figure 5:
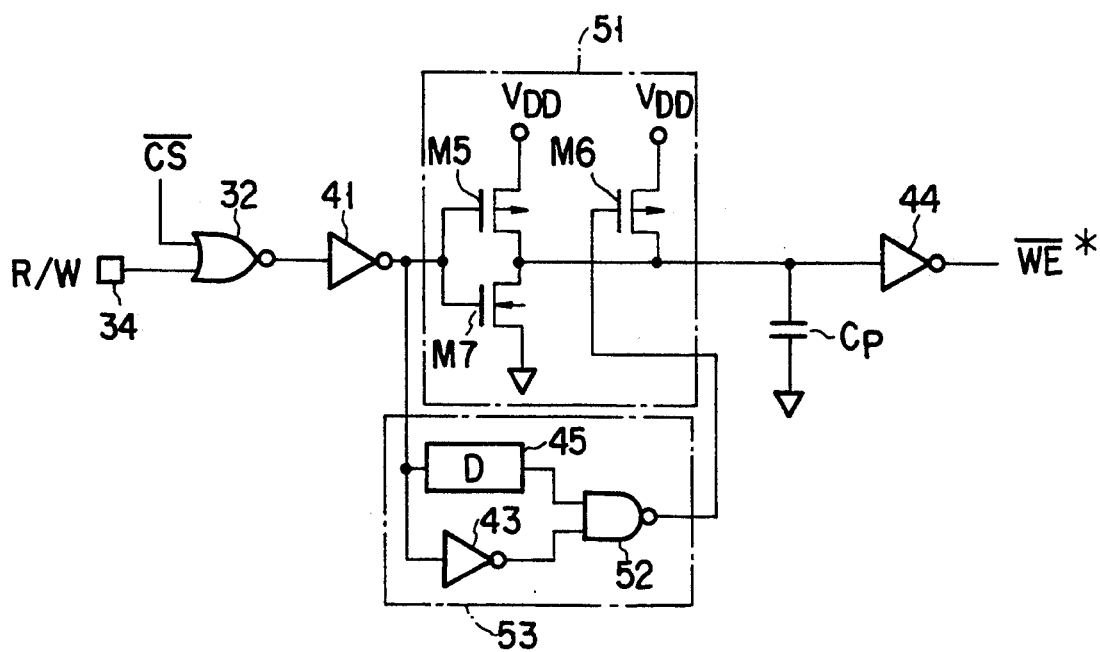
FIG. 5 is a circuit diagram showing the second embodiment of the present invention.

FIG. 5 is a circuit diagram showing a read/write control circuit for an asynchronous RAM according to the second embodiment of the present invention. The same reference numerals in FIG. 5 denote the same parts as in FIG. 2, and only different portions will be described below. An inverter circuit 51 is connected to the output terminal of an inverter circuit 41. This inverter circuit 51 is constituted by P-channel transistors M5 and M6 and an N-channel transistor M7. More specifically, the gates of the P-channel transistor M5 and the N-channel transistor M7 are connected to the output terminal of the inverter circuit 41. The source and drain of the P-channel transistor M5 are respectively connected to a power supply $V_{DD}$ and the drain of the N-channel transistor M7. The source of the N-channel transistor M7 is grounded. The source of the P-channel transistor M6 is connected to the power supply $V_{DD}$, while its drain is connected to the drains of the P- and N-channel transistors M5 and M7. The size of the P-channel transistor M5 is set to be much smaller than that of the N-channel transistor M7. The output terminal of the inverter circuit 41 is connected to one input terminal of a NAND circuit 52 through a delay circuit 45, and is also connected to the other input terminal of the NAND circuit 52 through an inverter circuit 43. The output terminal of the NAND circuit 52 is connected to the gate of the P-channel transistor M6. The inverter circuit 43, the delay circuit 45, and the NAND circuit 52 constitute a monostable pulse generator 53.

In the above-described arrangement in FIG. 5, the threshold value of the inverter circuit 51 is determined by the ratio of the size, i.e., the gate width, of the p-channel transistor M5 to that of the N-channel transistor M7. As described above, since the size of the P-channel transistor M5 is much smaller than that of the N-channel transistor M7, the threshold value of the inverter circuit 51 is set to a threshold value which allows easy detection of a change from the write mode to the read mode. In this regard, the second embodiment is the same as the first embodiment. However, in the second embodiment, when the read mode shifts to the write mode, the P-channel transistor M6 is kept on for a predetermined period of time by the monostable pulse generator 53 to start a write operation. The P-channel transistor M5 is kept off. The width of a pulse generated by the monostable pulse generator 53 can be given as "$T_{WP}$- $T_D$" as indicated by the broken line in FIG. 4(e) so that the pulse falls at the same time when the address signal Add changes in level after, for example, the signal shown in FIG. 4(e) rises. With this operation, a read operation delay owing to the delay time $T_D$ immediately after a write operation can be prevented. When the read mode changes to the write mode, the threshold value of the inverter circuit 51 is set to a level which allows easy detection of a write operation. In this case, since the inverter circuit 41 need not drive the P-channel transistor M5, the operating speed can be further increased.

The circuits of the first and second embodiments are very effective when the capacitor $C_P$ drives a large wiring.

Figure 6:
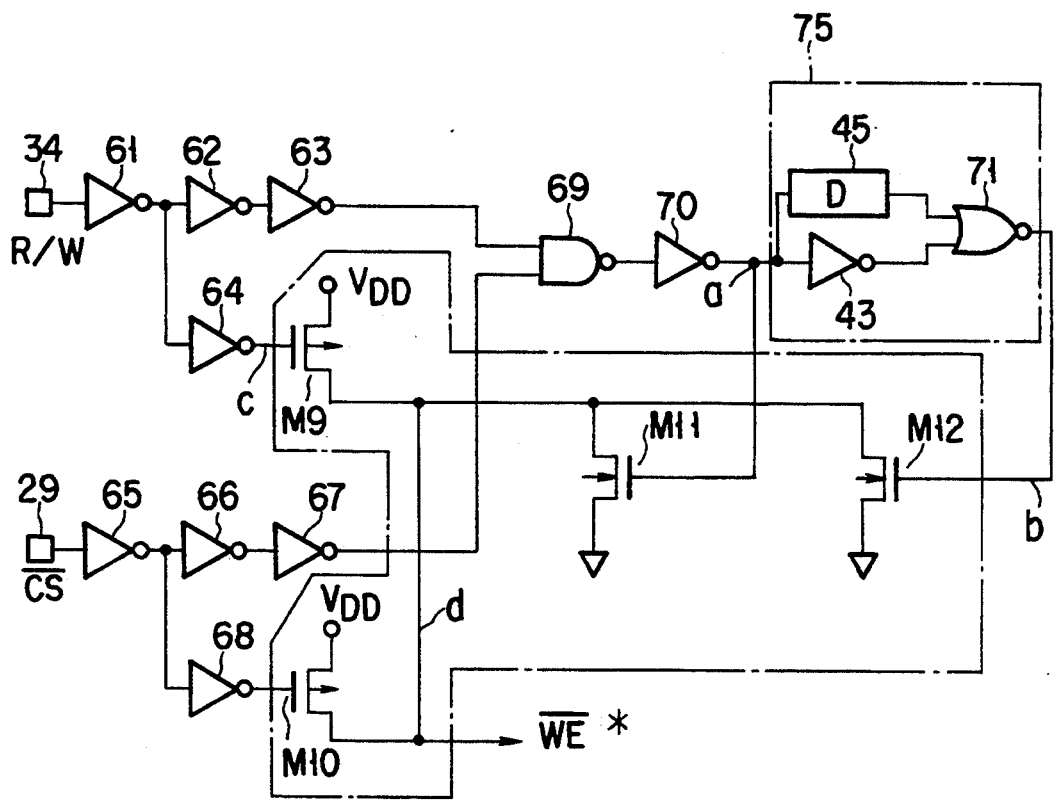
FIG. 6 is a circuit diagram showing the third embodiment of the present invention.
Figure 7:
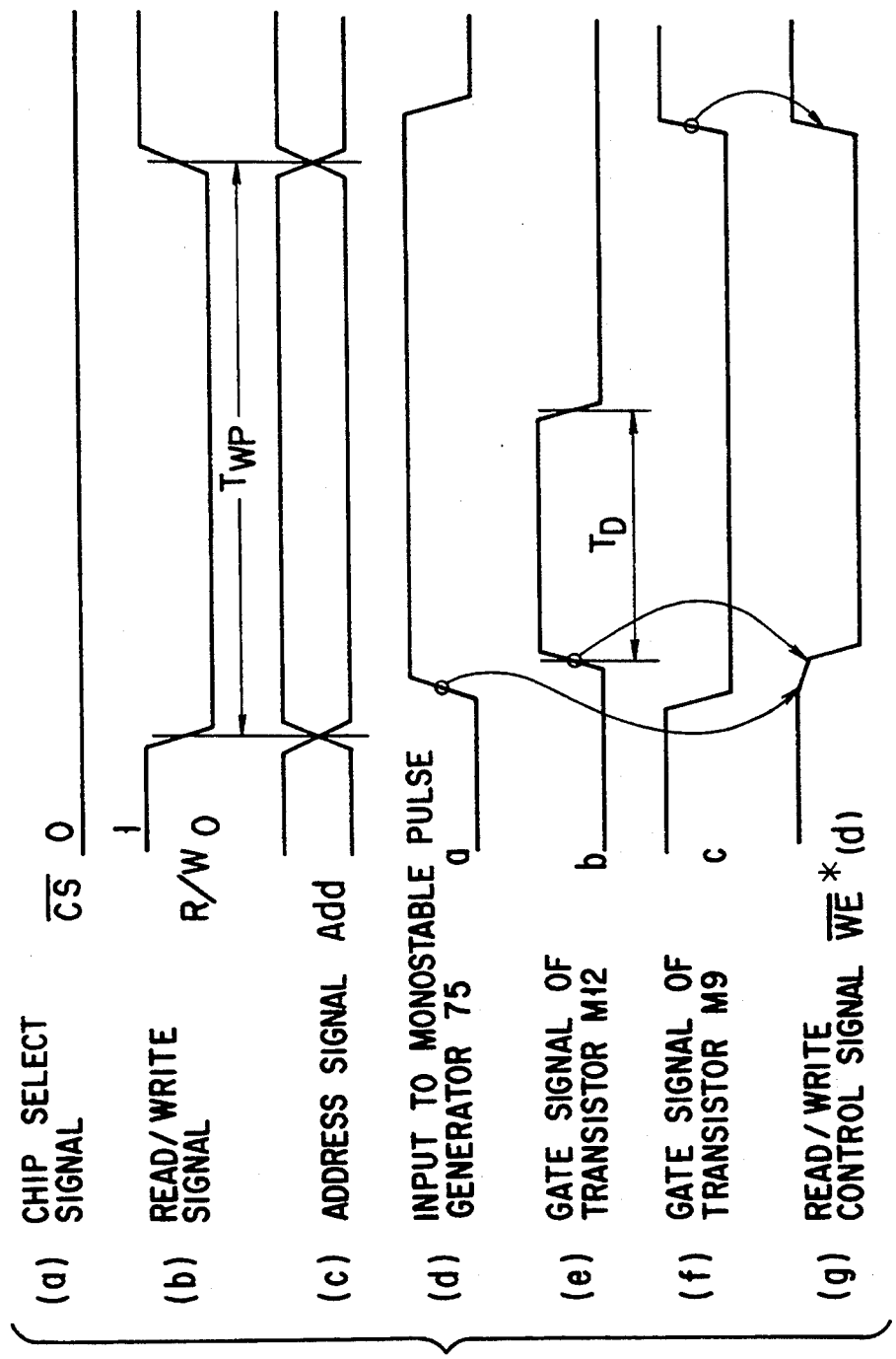
FIGS. 7(a) to 7(g) are timing charts for explaining an operation of the third embodiment shown in FIG. 6.

FIG. 6 is a circuit diagram showing the third embodiment of the present invention. Inverter circuits 61, 62, and 63 are connected in series with an input pin 34 to which a read/write signal R/W is input. The output terminal of the inverter circuit 61 is connected to the gate of a P-channel transistor M9. The source of the P-channel transistor M9 is connected to a power supply $V_{DD}$. Inverter circuits 65, 66, and 67 are connected in series with an input pin 29 to which a chip select signal $\overline{CS}$ is input. The output terminal of the inverter circuit 65 is connected to the gate of a p-channel transistor M10 through an inverter circuit 68. The source of the P-channel transistor M10 is connected to the power supply $V_{DD}$. The drains of the P-channel transistors M10 and M9 are connected to each other and are also connected to the other input terminal of a NOR circuit 33, an inverter circuit 35, and a gate circuit 23a. In addition, the drains of the P-channel transistors M10 and M9 are respectively connected to the drains of N-channel transistors M11 and M12. The sources of these N-channel transistors M11 and M12 are grounded. The output terminals of the inverter circuits 63 and 67 are connected to the input terminal of a NAND circuit 69. The output terminal of the NAND circuit 69 is connected to the gate of the N-channel transistor M11 through an inverter circuit 70 and is also connected to the input terminals of the delay circuit 45 and the inverter circuit 43. The output terminals of the delay circuit 45 and the inverter circuit 43 are connected to the input terminal of a NOR circuit 71. The delay circuit 45, the inverter circuit 43, and the NOR circuit 71 constitute a monostable pulse generator 75. The output terminal of the NOR circuit 71 is connected to the gate of the N-channel transistor M12. The gate width of the N-channel transistor M11 is set to be smaller than that of the N-channel transistor M12. Referring to FIG. 6, reference symbol $\overline{WE^*}$ denotes a read/write control signal.

FIGS. 7(a) to 7(g) are timing charts for explaining an operation of the third embodiment shown in FIG. 6. The logic of the above-described circuit is defined as $\overline{WE^*} = \overline{WE} + \overline{CE}$. When a data write operation is started, i.e., the read/write signal R/W changes from level "1" to level "0", as shown in FIG. 7(b), the P-channel transistor M9 is turned off, as shown in FIG. 7(f). The read/write signal R/W is supplied the N-channel transistor M11 through the inverter circuits 61, 62, and 63, the NAND circuit 69, and the inverter circuit 70 to turn on the transistor M11, and is further supplied to the N-channel transistor M12 trough the monostable pulse generator 75 to turn on the transistor M12. During the data write operation, as shown in FIG. 7(e), after a period of time corresponding to a time width $T_D$ of a pulse generated by the monostable pulse generator 75 elapses, the N-channel transistor M12 is turned off. Subsequently, only the N-channel transistor M11 having a small size is kept on during a write time $T_{WP}$. As shown in FIG. 7(g), the read/write control signal $\overline{WE^*}$ gradually rises when only the N-channel transistor M11 is in an ON state, but abruptly rises when both the transistors M11 and M12 are in an ON state. In contrast to this, when the read mode is to be restored from the write mode, i.e., the read/write signal R/W changes from level "0" to level "1", at least the P-channel transistor M9, of the P-channel transistors M9 and M10, is turned on. When the P-channel transistor M9 is turned on, as shown in FIG. 7(f), the N-channel transistor M11 is directly turned off, and the read/write control signal $\overline{WE^*}$ changes from level "0" to level "1". This is shown in FIG. 7(g). As a result, the write mode shifts to the read mode. In the third embodiment, the same effects as those of the first and second embodiments can be obtained. In addition, in the third embodiment, the P-channel transistors M9 and M10 can be connected to each other to realize a wired-OR function. Therefore, a shift from the write mode to the read mode can be performed without the mediacy of the inverter circuits 61, 62, 63, and 70 and logic circuits such as the NAND circuit 69, and a read operation immediately after a write operation can be performed at higher speed.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A read/write control circuit for a random access memory, comprising:

a supply circuit for supplying a read/write control signal to said random access memory to asynchronously control a read/write state thereof with a binary potential; and a shift circuit, responsive to said read/write control signal, for shifting a threshold value of said supply circuit to a level close to a read potential during a write operation of said random access memory and to a level close to a write potential during a read operation of the random access memory in response to a change in the read/write control signal.

2. A circuit according to claim 1, wherein said supply circuit comprises a first P-channel transistor having a gate to which a read/write signal is supplied, a second P-channel transistor having one current path end connected to a first power supply and a second current path end connected to one current path end of said first P-channel transistor, an N-channel transistor having a gate to which the read/write signal is supplied, one current path end connected to a second current path end of said first P-channel transistor and a second current path end connected to a second power supply, and a third P-channel transistor having a gate connected to the gate of said first P-channel transistor, one current path end connected to said first power supply and a second current path end connected to said second current path end of said first P-channel transistor, said third P-channel transistor having a current driving capacity smaller than that of each of said N-channel transistor and said first and second P-channel transistors, and said shift circuit comprises an inverter circuit for inventing the read/write signal, and a delay circuit for supplying an output signal from said inverter circuit to the gate of said second P-channel transistor upon delaying the output signal by a period of time slightly shorter than a data write time.

3. A circuit according to claim 1, wherein said supply circuit comprises a first P-channel transistor having a gate to which a read/write signal is supplied, and one current path end connected to a first power supply, an N-channel transistor having a gate to which the read/write signal is supplied, one current path end connected to a second path end of said first P-channel transistor and a second current path end connected to a second power supply, said N-channel transistor having a current driving capacity different from that of said first P-channel transistor, and a second P-channel transistor having one current path end connected to said first power supply and a second current path end connected to said second current path end of said first P-channel transistor, and said shift circuit comprises a delay circuit for delaying the read/write signal by a period of time slightly shorter than a data write time, an inverter circuit, connected in parallel with said delay circuit, for inverting the read/write signal, and a NAND circuit for supplying a NAND of an output signal from said inverter circuit and an output signal from said delay circuit to the gate of said second P-channel transistor.

4. A circuit according to claim 1, wherein said supply circuit comprises a first P-channel transistor having a gate to which the read/write signal is supplied, and one current path end connected to a first power supply, a second P-channel transistor having a gate to which an element select signal is supplied, and one current path end connected to said first power supply, and first and second N-channel transistors, each having one current path end connected to a second current path end of a corresponding one of said first and second P-channel transistors and a second current path end connected to a second power supply, said first and second N-channel transistors having different current driving capacities, and said shift circuit comprises a NAND circuit for calculating a NAND of the read/write signal and an inverted signal of the element select signal, a delay circuit for delaying an inverted output signal from said NAND circuit by a period of time slightly shorter than a data write time, an inverter circuit, connected in parallel with said delay circuit, for inverting the inverted output signal from said NAND circuit, and a NOR circuit for supplying a NOR of an output signal from said inverter circuit and the output signal from said delay circuit to the gates of said first and second N-channel transistors.

5. A read/write control circuit for a random access memory, comprising:

a first logic circuit for receiving a read/write signal for asynchronously determining a read/write state of a memory cell with a binary potential, said first logic circuit having a first threshold value which is close to a potential indicating a write state and serves to detect a change from the potential indicating the write state to a potential indicating a read state, and a second threshold value which is close to the potential indicating the read state and serves to detect a change from the potential indicating the read state to the potential indicating the write state; and a second logic circuit for selecting the first threshold value in accordance with the read signal, and selecting the second threshold value in accordance with the write signal.

6. A circuit according to claim 5, wherein said first logic circuit comprises a first P-channel transistor having a gate to which the read/write signal is supplied, a second P-channel transistor having one current path end connected to a first power supply and a second current path end connected to one current path end of said first P-channel transistor, an N-channel transistor having a gate to which the read/write signal is supplied, one current path end connected to a second current path end of said first P-channel transistor and a second current path end connected to a second power supply, and a third P-channel transistor having a gate connected to the gate of said first P-channel transistor, one current path end connected to said first power supply, a second current path end connected to said second current path end of said first P-channel transistor, said third P-channel transistor having a current driving capacity smaller than that of each of said N-channel transistor and said first and second P-channel transistors, and said second logic circuit comprises an inverter circuit for inverting the read/write signal, and a delay circuit for supplying an output signal from said inverter circuit to the gate of said second P-channel transistor upon delaying the output signal by a period of time slightly shorter than a data write time.

7. A circuit according to claim 5, wherein said first logic circuit comprises a first P-channel transistor having a gate to which the read/write signal is supplied, and one current path end connected to a first power supply, an N-channel transistor having a gate to which the read/write signal is supplied, one current path end connected to a second path end of said first P-channel transistor and a second current path end connected to a second power supply, said N-channel transistor having a current driving capacity different from that of said first P-channel transistor, and a second P-channel transistor having one current path end connected to said first power supply and a second current path end connected to said second current path end of said first P-channel transistor, and said second logic circuit comprises a delay circuit for delaying the read/write signal by a period of time slightly shorter than a data write time, an inverter circuit, connected in parallel with said delay circuit, for inverting the read/write signal, and a NAND circuit for supplying a NAND of an output signal from said inverter circuit and the output signal from said delay circuit to the gate of said second P-channel transistor.

8. A circuit according to claim 5, wherein said first logic circuit comprises a first P-channel transistor having a gate to which the read/write signal is supplied, and one current path end connected to a first power supply, a second P-channel transistor having a gate to which an element select signal is supplied, and one current path end connected to said first power supply, and first and second N-channel transistors, each having one current path end connected to a second current path end of a corresponding one of said first and second P-channel transistors and a second current path end connected to a second power supply, said first and second N-channel transistors having different current driving capacities, and said shift circuit comprises a NAND circuit for calculating a NAND of the read/write signal and an inverted signal of the element select signal, a delay circuit for delaying an inverted output signal from said NAND circuit by a period of time slightly shorter than a data write time, an inverter circuit, connected in parallel with said delay circuit, for inverting the inverted output signal from said NAND circuit, and a NOR circuit for supplying a NOR of an output signal from said inverter circuit and the output signal from said delay circuit to the gates of said first and second N-channel transistors.

* * * * *